(12) United States Patent
Hymas et al.

(10) Patent No.: US 10,700,077 B2
(45) Date of Patent: Jun. 30, 2020

(54) MEMORY CELL WITH A FLAT-TOPPED FLOATING GATE STRUCTURE

(71) Applicant: Microchip Technology Incorporated, Chandler, AZ (US)

(72) Inventors: Mel Hymas, Camas, WA (US); James Walls, Mesa, AZ (US); Sonu Daryanani, Tempe, AZ (US)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 0 days.

(21) Appl. No.: 15/921,858

(22) Filed: Mar. 15, 2018

(65) Prior Publication Data

US 2019/0206881 A1    Jul. 4, 2019

Related U.S. Application Data

(60) Provisional application No. 62/613,036, filed on Jan. 2, 2018.

(51) Int. Cl.
   *H01L 27/11517* (2017.01)
   *H01L 27/105* (2006.01)
   (Continued)

(52) U.S. Cl.
   CPC .... *H01L 27/11517* (2013.01); *H01L 27/1052* (2013.01); *H01L 29/40114* (2019.08);
   (Continued)

(58) Field of Classification Search
   None
   See application file for complete search history.

(56) References Cited

U.S. PATENT DOCUMENTS

| | | | | |
|---|---|---|---|---|
| 5,708,285 A | * | 1/1998 | Otani | G11C 11/5621 |
| | | | | 257/315 |
| 5,776,810 A | * | 7/1998 | Guterman | G11C 11/5621 |
| | | | | 257/E27.103 |

(Continued)

OTHER PUBLICATIONS

Partial International Search Report and Written Opinion, U.S. Appl. No. 15/921,858, 14 pages, dated Mar. 18, 2019.

(Continued)

*Primary Examiner* — J. H. Hur
(74) *Attorney, Agent, or Firm* — Slayden Grubert Beard PLLC (57) ABSTRACT

A memory cell, e.g., a flash memory cell, includes a substrate, a flat-topped floating gate formed over the substrate, and a flat-topped oxide region formed over the flat-topped floating gate. The flat-topped floating gate may have a sidewall with a generally concave shape that defines an acute angle at a top corner of the floating gate, which may improve a program or erase efficiency of the memory cell. The flat-topped floating gate and overlying oxide region may be formed with without a floating gate thermal oxidation that forms a conventional "football oxide." A word line and a separate erase gate may be formed over the floating gate and oxide region. The erase gate may overlap the floating gate by a substantially greater distance than the word line overlaps the floating gate, which may allow the program and erase coupling to the floating gate to be optimized independently.

13 Claims, 5 Drawing Sheets

(51) Int. Cl.
   *H01L 21/28*   (2006.01)
   *H01L 29/788*  (2006.01)
   *H01L 29/423*  (2006.01)
   *H01L 29/66*   (2006.01)

(52) U.S. Cl.
   CPC .. *H01L 29/42328* (2013.01); *H01L 29/66825* (2013.01); *H01L 29/7881* (2013.01); *G11C 2216/02* (2013.01); *G11C 2216/04* (2013.01); *G11C 2216/10* (2013.01)

(56) References Cited

U.S. PATENT DOCUMENTS

| | | | | |
|---|---|---|---|---|
| 5,986,303 | A * | 11/1999 | Choi | H01L 29/66825 257/316 |
| 6,071,777 | A | 6/2000 | Chen | 438/257 |
| 6,130,132 | A | 10/2000 | Hsieh et al. | 438/264 |
| 6,136,653 | A * | 10/2000 | Sung | H01L 21/28273 257/E21.209 |
| 6,368,976 | B1 | 4/2002 | Yamada | 438/713 |
| 2002/0102774 | A1 * | 8/2002 | Kao | G11C 16/0416 438/142 |
| 2005/0158975 | A1 | 7/2005 | Liu et al. | 438/593 |
| 2005/0269622 | A1 | 12/2005 | Klinger et al. | 257/315 |
| 2006/0199336 | A1 | 9/2006 | Kang et al. | 438/261 |
| 2007/0048924 | A1 | 3/2007 | Yoon et al. | 438/211 |
| 2008/0149985 | A1 | 6/2008 | Liu et al. | 257/315 |

OTHER PUBLICATIONS

International Search Report and Written Opinion, Application No. PCT/US2018/066373, 19 pages, dated May 22, 2019.

\* cited by examiner

MEMORY CELL WITH A FLAT-TOPPED FLOATING GATE STRUCTURE

RELATED PATENT APPLICATION

This application claims priority to commonly owned U.S. Provisional Patent Application No. 62/613,036 filed Jan. 2, 2018, which is hereby incorporated by reference herein for all purposes.

TECHNICAL FIELD

The present disclosure relates to memory cells, e.g., flash memory cells, and more particularly, to a memory cell having a flat-topped floating gate structure.

BACKGROUND

Certain memory cells, e.g., flash memory cells, include at least one floating gate programmed and erased through one or more program/erase gates, word lines, or other conductive element(s). Some memory cells use a common program/erase gate extending over a floating gate to both program and erase the cell. In some implementations, the floating gate is formed by a Poly1 layer, while the program/erase gate is formed by a Poly2 layer that partially overlaps the underlying Poly1 floating gate in the lateral direction. For some memory cells, the manufacturing process includes a floating gate thermal oxidation process that forms a football-shaped oxide over the Poly 1 floating gate, as discussed below.

Figure 1:
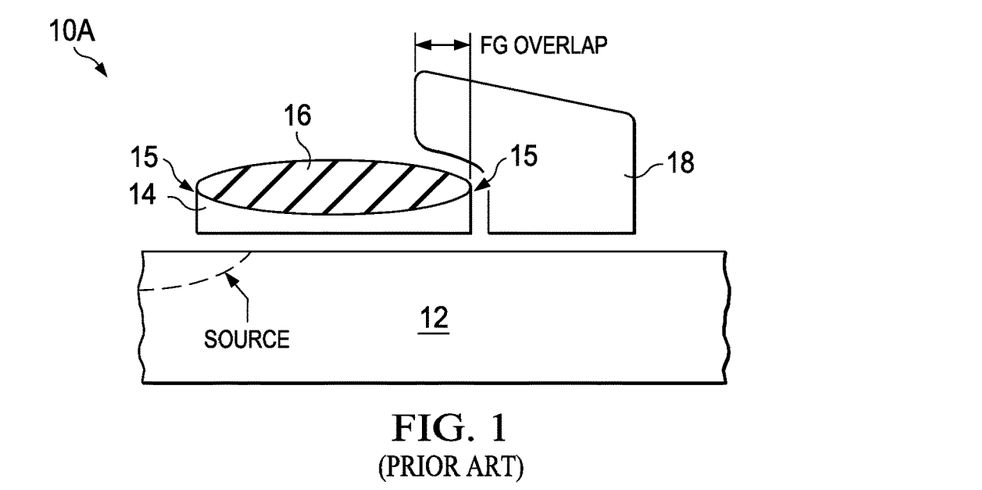
FIG. 1 illustrates a partial cross-sectional view of an example conventional memory cell including a Poly 1 floating gate, a "football oxide" formed over the floating gate, and a Poly2 common program/erase gate extending partially over the floating gate.

FIG. 1 illustrates a partial cross-sectional view of an example memory cell 10A, e.g., a flash memory cell, including a Poly1 floating gate 14 and an overlying football-shaped oxide region ("football oxide") 16 formed over a substrate 12, and a Poly2 gate 18 (e.g., a word line, erase gate, or common program/erase gate) extending partially over the floating gate 14. The football oxide 16 is formed over the floating gate 14 by a thermal oxidation process on floating gate 14, which defines upwardly-pointing tips 15 at the edges of floating gate 14. These FG tips 15 may define a conductive coupling to adjacent program/erase gates, e.g., the Poly2 gate 18 shown in FIG. 1.

After forming the floating gate 14 and football oxide 16, a source dopant implant may be performed, which is self-aligned by the lateral edge of the floating gate 14, followed by an anneal process that diffuses the source dopant outwardly such that the resulting source region extends partially under the floating gate 14, as shown in FIG. 1. However, during the source dopant implant, a portion of the dopant may penetrate through the football oxide 16 and into the underlying floating gate 14, which may result in a dulling or blunting of one or more floating gate tips 15, e.g., after subsequent oxidation steps (wherein the dopant absorbed in the floating gate 14 promotes oxidation of the floating gate tips 15). This dulling or blunting of the floating gate tip(s) 15 may decrease the efficiency of erase and/or program operations of the memory cell 10A.

Figure 2A:
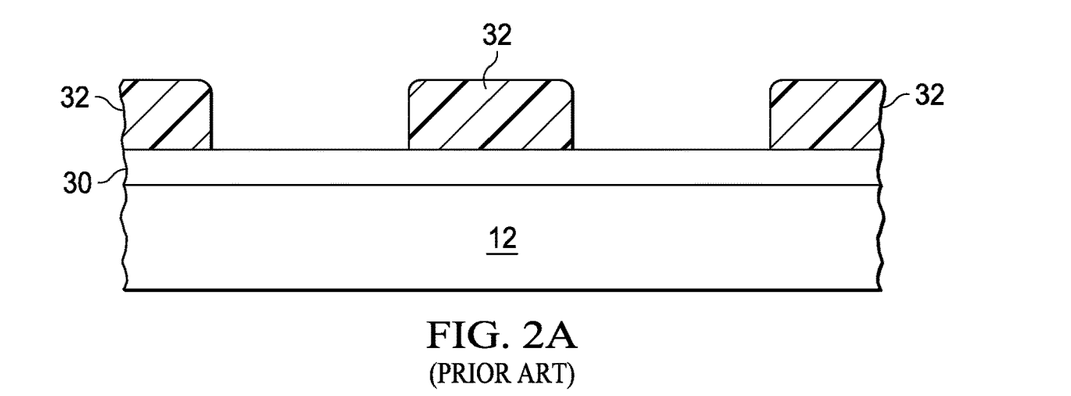
FIGS. 2A and 2B illustrate example cross-sections taken at selected times during a conventional process for forming floating gates with a conventional "football oxide" over each floating gate.
Figure 2B:
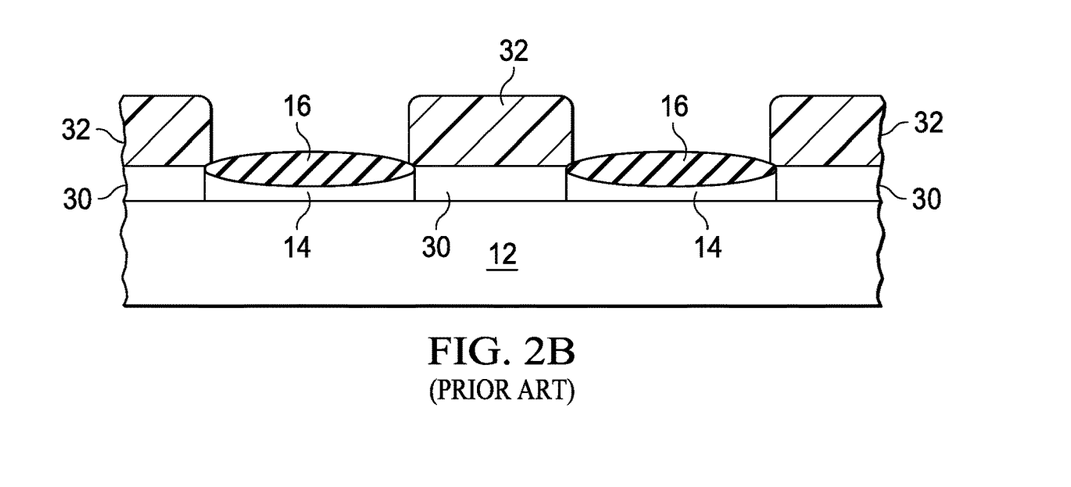

FIGS. 2A and 2B illustrate example cross-sections taken at selected times during a conventional manufacturing process for the conventional memory cell 10A shown in FIG. 2, e.g., a flash memory cell including multiple floating gates. As shown in FIG. 2A, a Poly1 layer 30 may be deposited over a silicon substrate. A nitride layer may then be deposited and patterned using known techniques to form a hard mask 32. As shown in FIG. 2B, a floating gate oxidation process may then be performed, which forms a football oxide 16 over areas of the Poly1 layer 30 exposed through the nitride mask 32 (which subsequently defines the floating gates 14). The nitride mask 32 may subsequently be removed, followed by a plasma etch to remove portions of the Poly1 layer 30 uncovered by each football oxide 16, which defines the lateral extent of each floating gate 14. This may be followed by a source implant and/or formation of a Poly2 layer (e.g., to form a word line, erase gate, coupling gate, etc.), depending on the particular implementation.

Figure 3:
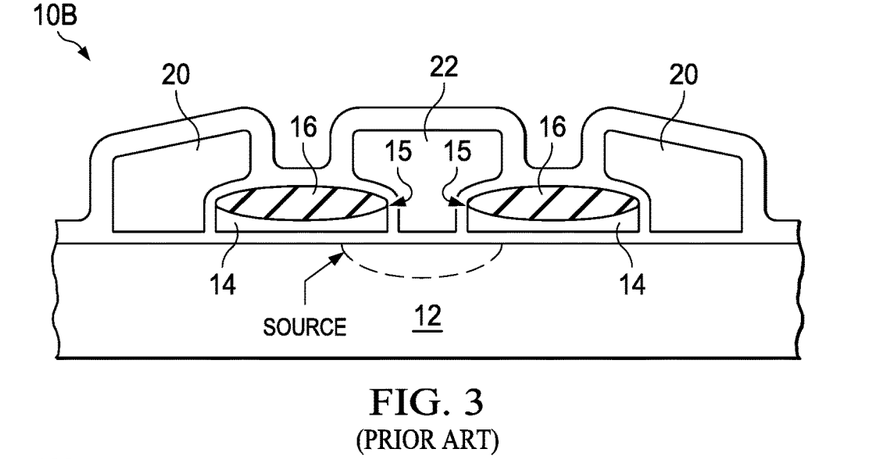
FIG. 3 illustrates example mirrored memory cell (e.g., a SuperFlash cell) including two floating gates, a word line formed over each floating gate, and a common erase gate formed over both floating gates, wherein the floating gate tips under the common erase gate may be dulled or blunted by conventional processing steps.

FIG. 3 illustrates another example mirrored memory cell 10B (e.g., a SuperFlash cell) including two spaced-apart floating gates 14, a word line 20 formed over each floating gate 14, and a common erase gate or "coupling gate" 22 formed between and extending over both floating gates 14 (such that the program and erase couplings to each respective floating gate 14 are decoupled), and a source region formed below the common erase gate. In this cell, the source region may be formed before forming the word lines 20 and the coupling gate 22. During the source implant, the portions of each floating gate 14 that are not masked by resist are relatively unprotected, such that a portion of the source dopant may penetrate through each football oxide 16 and into each underlying floating gate 14, which may result in a dulling or blunting of the floating gate tips 15 located over the source region, as discussed above.

SUMMARY

Embodiments of the present disclosure provide a memory cell (e.g., flash memory cell) and method for forming a memory cell having at least one flat-topped floating gate and oxide cap (which may also be flat-topped). In some embodiments, the memory cell may be formed without performing a floating gate thermal oxidation, which is performed in conventional techniques to produce the conventional football oxide over the floating gate. The feature of removing the floating gate thermal oxidation step, and the resulting flat-topped floating gate and oxide cap may provide various advantages over conventional processes and memory cells, as discussed herein.

Embodiments of the present invention may provide any or all of the following advantages. First, in some embodiments, the size of the floating gate as defined by openings etched in FG nitride does not grow. Thus, oxide encroachment under the edges of FG nitride during thermal oxidation may be reduced or eliminated. Further, the nitride spacer conventionally used to protect the FG tips during HVII (High Voltage Ion Implant) of the source region may be reduced in thickness or completely eliminated. Further, a thinner (or omitted) spacer moves the HVII closer to the FG edge, and may thus allow a lower HVII implant energy to be used.

Figure 4:
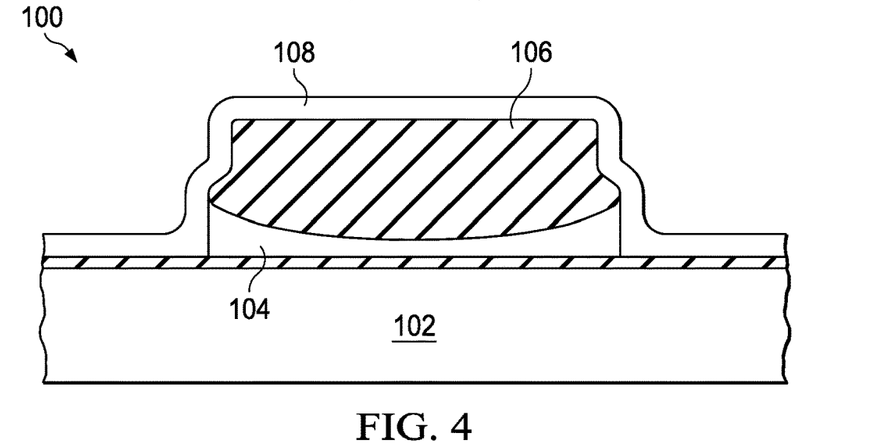
FIG. 4 illustrates a cross-section of an example memory cell structure including a floating gate with an overlying flat-topped oxide region including a "football oxide" and an additional oxide deposit, according to one embodiment of the present invention.

In addition, embodiments may provide an improvement in program/erase efficiency, which may allow the use of lower operating voltages (e.g., medium voltage (MV) devices instead of high voltage (HV)). The elimination of HV devices may simplify the process flow (reduce cost) and allow for further cell shrink. Further, disclosed processes may provide improved control of the cell in photolithography. The cell may have a strong sensitivity on the poly2 to poly1 overlap making it an important control parameter in the Fab. The proposed may reduce the criticality of this alignment because the coupling of the poly2 to poly1 may be set by the side wall alone. The top surface of the poly2 may be spaced away from the floating gate poly1 with the thick oxide layer, e.g., as shown in FIG. 4 discussed below.

Some embodiments allow for varying the thickness or doping of the poly1 independent of the memory cell, e.g., as defined by requirements for a poly2-poly1 capacitor. In contrast, the conventional approach sets a narrow boundary of these poly1 floating gate parameters, which are typically set to achieve a certain shape of the football oxidation created over the floating gate to create a sharp poly1 tip for erase efficiency.

One embodiment provides a method of forming a memory cell, including forming a poly layer over a substrate; forming a patterned mask that covers a first portion of the poly layer and exposes a flat-topped second portion of the poly layer having a flat top surface; depositing an oxide layer over the exposed flat-topped second portion of the poly layer; removing portions of the poly layer to define a flat-topped floating gate including the second portion of the poly layer; depositing a spacer layer over the flat-topped floating gate and the oxide layer; and performing a source implant in the substrate adjacent the flat-topped floating gate, wherein the spacer layer shields the underlying flat-topped floating gate from the source implant.

The method may be performed without performing a floating gate thermal oxidation, which is performed in conventional techniques to produce the conventional "football" oxide over the floating gate.

In some embodiments, the oxide layer is deposited over the exposed flat-topped second portion of the poly layer using an HDP (High Density Plasma) oxide deposition.

In some embodiments, the oxide layer has a flat bottom surface in contact with the flat top surface of the floating gate, and a flat top surface. A chemical mechanical planarization (CMP) may be performed to define the flat top surface of the oxide layer.

In some embodiments, the floating gate has at least one sidewall having a generally concave shape. The generally concave shape of the floating gate sidewall may define an acute angle at a top corner of the floating gate, which improves a program or erase efficiency of the memory cell.

In some embodiments, the patterned mask comprises nitride. Further, in some embodiments, the spacer layer comprises a nitride layer having a thickness of less than 300 Å, e.g., in the range of 150-250 Å.

The method may further include forming a word line and a separate erase gate over the floating gate. In some embodiments, the word line overlaps the floating gate by a first distance and the erase gate overlaps the floating gate by a second distance substantially larger than the first distance. For example, the second distance may be at least 1.5 times, at least 2 times, at least 3 times, at least 4 times, at least 5 times, at least 6 times, at least 7 times, at least 8 times, at least 9 times, or at least 10 times as great as the first distance.

In some embodiments, the memory cell comprises a flash memory cell, e.g., a SuperFlash memory cell.

Other embodiments provide a memory cell formed by the process disclosed above, e.g., a process including forming a poly layer over a substrate; forming a patterned mask that covers a first portion of the poly layer and exposes a flat-topped second portion of the poly layer having a flat top surface; depositing an oxide layer over the exposed flat-topped second portion of the poly layer; removing portions of the poly layer to define a flat-topped floating gate including the second portion of the poly layer; depositing a spacer layer over the flat-topped floating gate and the oxide layer; and performing a source implant in the substrate adjacent the flat-topped floating gate, wherein the spacer layer shields the underlying flat-topped floating gate from the source implant.

Thus, embodiments of the present invention provide a memory cell, e.g., flash memory cell, that is formed without performing a floating gate thermal oxidation that is performed in conventional techniques to produce the conventional "football oxide" over the floating gate.

Other embodiments provides a memory cell, e.g., a flash memory cell, including a substrate, a flat-topped floating gate formed over the substrate and having a flat top surface, an oxide layer formed over the flat-topped floating gate, and a doped source region in the substrate adjacent the floating gate and extending partially under the floating gate. The memory cell may include a word line and a separate erase gate formed over the floating gate, wherein the word line overlaps the floating gate by a first distance and the erase gate overlaps the floating gate by a second distance substantially larger than the first distance.

BRIEF DESCRIPTION OF THE DRAWINGS

Example aspects of the present disclosure are described below in conjunction with the figures, in which.

DETAILED DESCRIPTION

Embodiments of the present disclosure provide a memory cell (e.g., flash memory cell) and method for forming a memory cell having at least one flat-topped floating gate and oxide cap (which may also be flat-topped). The memory cell may be formed without performing a floating gate thermal oxidation, which is performed in conventional techniques to produce the conventional "football" oxide over the floating gate. The feature of removing the floating gate thermal oxidation, and the resulting flat-topped floating gate and oxide cap may provide various advantages over conventional processes and memory cells, as discussed herein.

The disclosed concepts may be applied to any suitable types of memory cells, e.g., flash memory cells. For example, the disclosed concepts may be applied to certain SuperFlash memory cells manufactured by Microchip Technology Inc., having a headquarters at 2355 W. Chandler Blvd., Chandler, Ariz. 85224, or modified versions of such memory cells.

FIG. 4 illustrates a cross-section of an example memory cell structure 100 formed according to an embodiment of the present invention. Memory cell structure 100 includes a floating gate 104 formed over a substrate 102, and a flat-topped oxide region or "oxide cap" 106 formed over the floating gate 104, a spacer layer 108 (e.g., nitride layer) formed over the floating gate 104/oxide 106 structure. Flat-topped oxide region 106 may be formed by forming a "football oxide" over a floating gate structure and a subsequent oxide deposit and processing to define a flat-topped oxide region 106. The example structure shown in FIG. 4 may be applied or incorporated in any suitable memory cell, e.g., SuperFlash or other flash memory cells having one or more floating gates 104.

Figure 5:
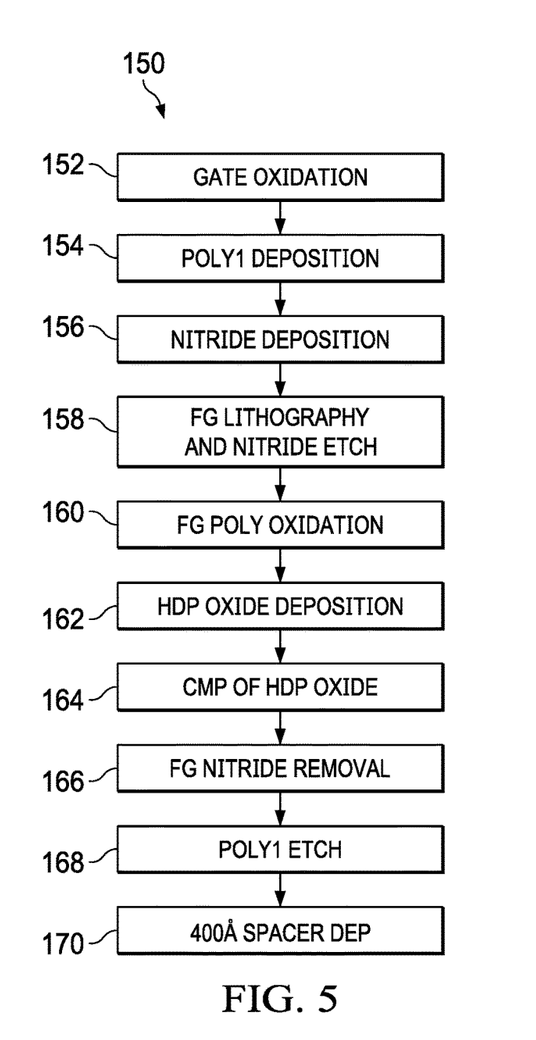
FIG. 5 illustrates an example process for forming the example memory cell structure shown in FIG. 4, according to one embodiment.

FIG. 5 illustrates an example method 150 of forming the example memory cell structure 100 shown in FIG. 4. At 152, a gate oxidation is performed or occurs on a top surface of substrate 102. At 154, a poly1 layer is deposited over the substrate 102. At 156, a nitride layer is deposited over the poly 1 layer 102. At 158, a floating gate structure is formed from the poly1 layer, e.g., by a FG lithography and nitride etch process. At 160, a FG poly oxidation is performed, which may form a football-shaped oxide over the floating gate structure and define the concave upper surface of the floating gate structure. At 162, an HDP oxide deposition may be performed over the football-shaped oxide. At 164, a CMP may be performed on the HDP oxide to define the flat-topped oxide region 106 shown in FIG. 4. At 166, a floating gate nitride removal process may be performed. At 168, a poly1 etch may be performed to define the shape of floating gate 104 shown in FIG. 4, by removing the portions of poly1 on the lateral side of the illustrated floating gate 104. At 170, a spacer layer 108 may be deposited over the structure. For example, the spacer layer 108 may comprise a nitride layer having a thickness in the range of 200 Å-600 Å, or in the range of 300 Å-500 Å, e.g., a thickness of about 400 Å. Spacer layer 108 may be used for aligning a source implant, e.g., a HVII (High Voltage Ion Implant) source implant, to form a source region in the substrate 102. Spacer layer 108 may be a sacrificial layer that is removed after the source implant for subsequent processing of the cell, e.g., growing a tunnel oxide layer and depositing and etching a poly2 layer to form a word line, erase gate and/or other program or erase nodes.

Figure 6:
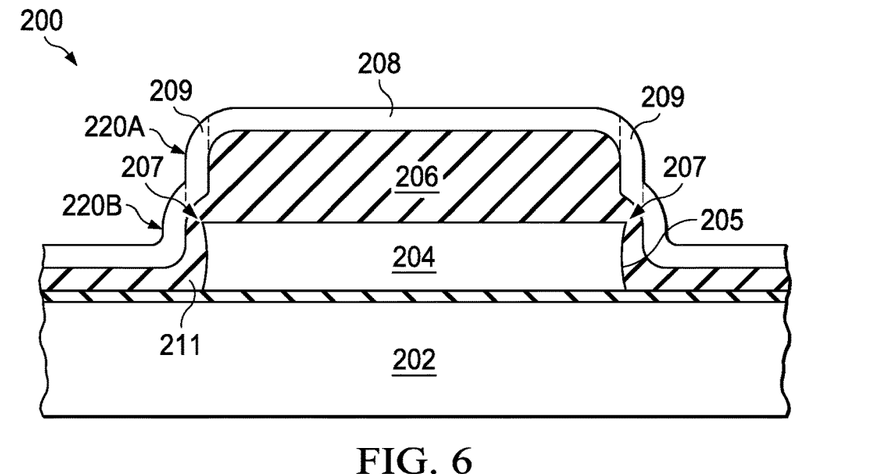
FIG. 6 illustrates a cross-section of an example memory cell structure including a flat-topped floating gate with an overlying flat-topped oxide region, according to one embodiment of the present invention.

FIG. 6 illustrates a portion of another example memory cell structure 200 having a flat-top floating gate 204 and a flat-top oxide cap or "stud" region 206 formed over the flat-top floating gate 204, according to one embodiment of the present invention. The flat-top floating gate 204 and overlying flat-top oxide cap 206 may be formed in any suitable manner, for example using the methods shown in FIG. 7 or 8, discussed below.

As shown in FIG. 6, the process of forming memory cell structure 200 (e.g., using the method of FIG. 7 or FIG. 8) may form concave floating gate sidewalls 205, which may define acute (<90 degree) or reentrant upper corners or "tips" 207 of the floating gate 204, which may increase the erase and/or program efficiency of the memory cell. The floating gate sidewalls 205 may become concave due to stress forces, fluid flow of oxide as it grows, and/or the oxidation process itself.

In addition, the oxide cap 206 created by this process may be offset inwardly from the sidewall oxide layer 211, to define a step in the oxide region 206 near the upper corners 207 of the floating gate 204. As a result of the this step, the nitride spacer 208 deposited over the oxide 206 may define vertically-extending regions 209 aligned over the upper corners of the floating gate, which act as shields that protect against a source implant dopant from penetrating down into the floating gate poly 204, to thereby maintain the acuteness of the floating gate tips 207.

Figure 7:
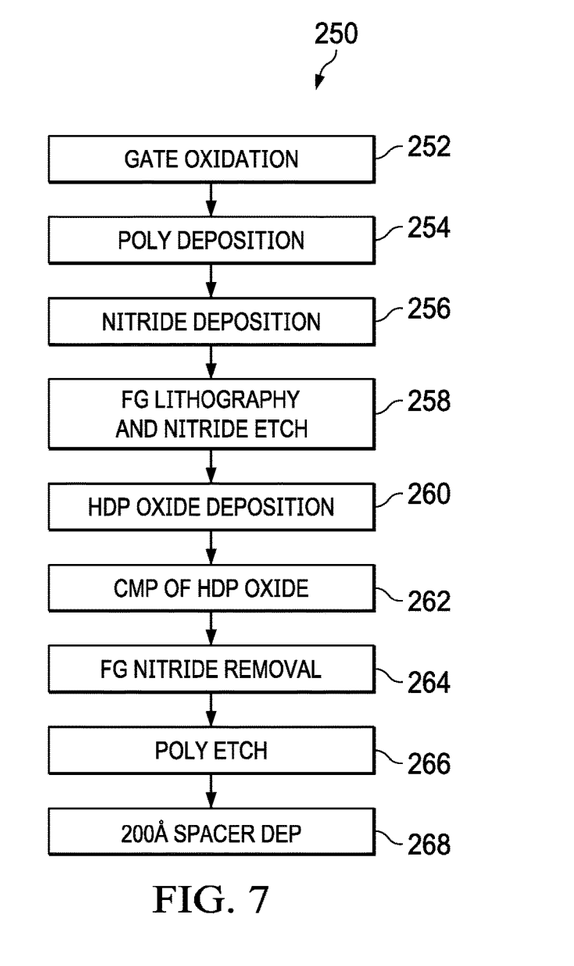
FIG. 7 illustrates an example process for forming the example memory cell structure shown in FIG. 6, according to one embodiment.

FIG. 7 illustrates an example method 250 of forming the example memory cell structure 200 shown in FIG. 6, according to an example embodiment. At 252, a gate oxidation is performed or occurs on a top surface of substrate 202. At 254, a poly1 layer is deposited over the substrate 202. At 256, a nitride layer is deposited over the poly 1 layer 202. At 258, a flat-topped floating gate structure is formed from the poly1 layer, e.g., by a FG lithography and nitride etch process. At 260, an HDP oxide deposition may be performed directly on the flat-topped floating gate structure. Thus, unlike example method 150 (FIG. 5) to form the cell structure 100 shown in FIG. 4, in this embodiment the FG poly oxidation step to form a football-shaped oxide over the floating gate structure (step 160 of method 150 discussed above) may be omitted. At 262, a CMP may be performed on the HDP oxide to define the flat-topped oxide region 206 shown in FIG. 4. At 264, a floating gate nitride removal process may be performed. At 266, a poly1 etch may be performed to define the shape of floating gate 204 shown in FIG. 4, by removing the portions of poly1 on the lateral side of the illustrated floating gate 204.

At 268, a spacer layer 208 may be deposited over the structure. Due to reduced oxide pullback, the required or optimal thickness of spacer layer 208 may be reduced as compared with spacer layer 108 used in the formation of memory cell structure 100 shown in FIG. 4, discussed above. For example, the spacer layer 208 may comprise a nitride layer having a thickness in the range of 100 Å-400 Å, or in the range of 150 Å-300 Å, e.g., a thickness of about 200 Å. At 270, a HVII (High Voltage Ion Implant) source implant may be performed, to form a source implant region in the substrate 202 that may be self-aligned with spacer layer 208. For example, the source implant may be self-aligned by an external lateral edge defined by spacer layer 208, e.g., lateral edge 220A or 220B shown in FIG. 6, depending on the relevant dimensions of the various regions of spacer layer 208 and/or the intensity/power of the HVII source implant. Spacer layer 208 may be used for aligning a source implant, e.g., a HVII (High Voltage Ion Implant) source implant, to form a source region in the substrate 202. In addition, as discussed above, spacer layer 208 may include vertically-extending regions 209 aligned over the upper corners of the floating gate, which act as shields that protect against the source implant dopant from penetrating down into the floating gate poly 204, to thereby maintain the acuteness of the floating gate tips 207. Spacer layer 208 may be a sacrificial layer that is removed after the HVII source implant for subsequent processing of the cell, e.g., growing a tunnel oxide layer and depositing and etching a poly2 layer to form a word line, erase gate and/or other program or erase nodes.

Figure 8:
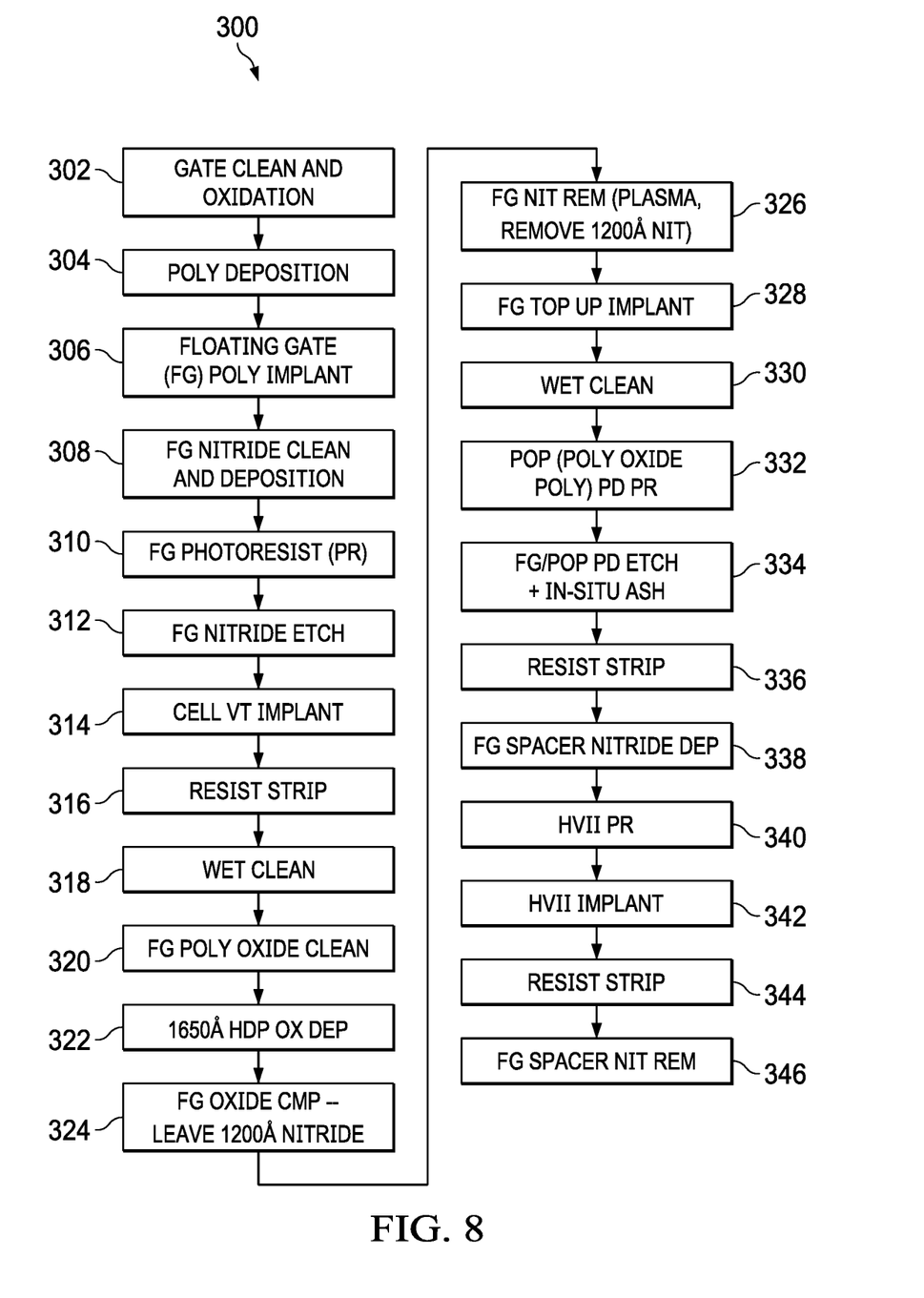
FIG. 8 illustrates another example process for forming the example memory cell structure shown in FIG. 6, according to one embodiment.

FIG. 8 illustrates another example method 300 of forming the example memory cell structure 200 shown in FIG. 6, according to an example embodiment. At 302, a gate clean oxidation is performed on a top surface of substrate 202. At 304, a FG poly (poly1) layer is deposited over the substrate 202. At 306, a FG poly implant is performed. At 308, a FG nitride clean and deposition is performed. At 310, a FG photoresist is formed. At 312, a FG nitride etch is performed. At 314, a cell Vt (voltage threshold) implant is performed. At 316, a resist strip is performed. At 318, a wet clean is performed. At 320, a FG poly oxide clean is performed.

At 322, an HDP oxide deposition is performed over the floating gate structure, with a selected oxide thickness, e.g., in the range of 1000 Å-2500 Å, or in the range of 1300 Å-2000 Å, or in the range of 1500 Å-1800 Å, e.g., a thickness of about 1650 Å. At 324, a FG oxide CMP is performed, e.g., to a depth that leaves approximately 1200 Å of the nitride layer. At 326, a FG nitride removal may be performed, e.g., a plasma etch to remove the 1200 Å nitride thickness. At 328, a FG top up implant may be performed. At 330, a wet clean is performed. At 332, a POP (poly oxide poly) photoresist is formed. At 334, a FG/POP etch and in-situ ash process is performed. At 336, a resist strip is performed. At 338, a FG nitride spacer is deposited over the structure. At 340, a HVII (High Voltage Ion Implant) photoresist is formed.

At 342, an HVII source implant is performed. As discussed above, the FG nitride spacer may include vertically-extending regions 209 aligned over the upper corners of the floating gate, which act as shields that protect against the HVII dopant from penetrating down into the FG poly, to thereby maintain the acuteness of the floating gate tips. At 344, a resist strip is performed. At 346, the FG nitride spacer is removed for subsequent processing of the cell. For example, a tunnel oxide layer may be grown over the structure, followed by depositing and etching a poly2 layer to form a word line, erase gate and/or other program or erase nodes.

Figure 9:
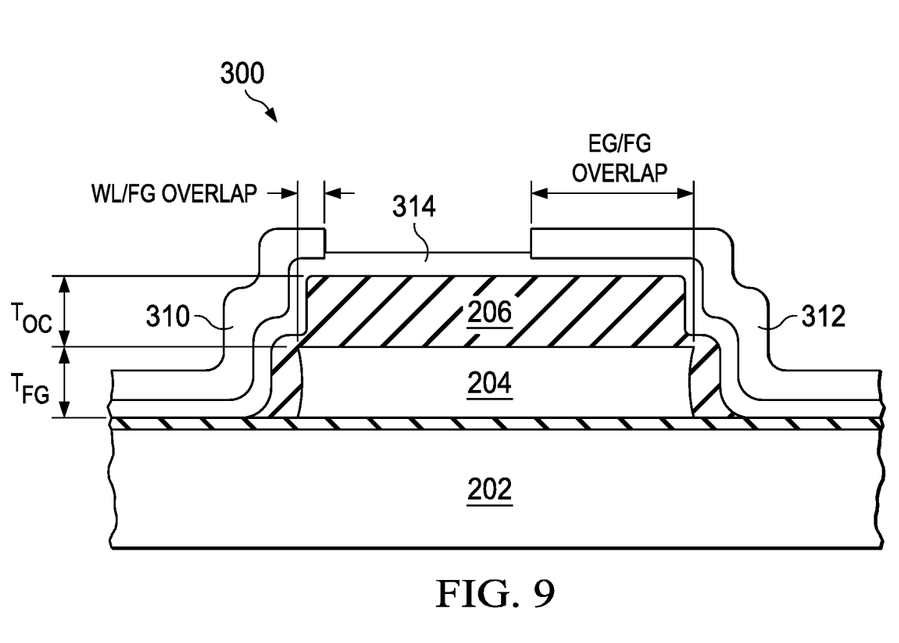
FIG. 9 illustrates a cross-section of an example memory cell including a flat-top floating gate, a flat-top oxide cap over the flat-top floating gate, and a word line and erase gate formed over the floating gate, according to one embodiment.

FIG. 9 illustrates a portion of a memory cell 300 including the memory cell structure 200 shown in FIG. 6, and a word line 310 extending over a first side of the floating gate 204, and an erase gate 312 extending partially over a second side of the floating gate 204. Word line 310 and erase gate 312 may be formed in any suitable manner, e.g., by growing a tunnel oxide 314 over the structure and depositing and etching a poly2 layer to define the word line 310 and erase gate 312.

As shown, the erase gate 312 may overlap the floating gate 204 ("EG/FG overlap") by a substantially greater distance than the word line 310 overlaps the floating gate 204 ("WL/FG overlap"). For example, the EG/FG overlap may be at least 1.5 times, at least 2 times, at least 3 times, at least 4 times, at least 5 times, at least 6 times, at least 7 times, at least 8 times, at least 9 times, or at least 10 times as great as the WL/FG overlap. This asymmetrical program/erase FG overlap over the flat-top floating gate 204 may provide certain advantages. For example, in addition to reducing the WL/FG overlap, a reduction in the floating gate 204 height/thickness ($T_{FG}$) and/or doping may decrease unwanted sidewall coupling between the word line (poly2) 310 and floating gate (poly1) 204. As another example, in addition to increasing the EG/FG overlap, a reduction of the oxide cap height/thickness (Toc) may increase the coupling between the erase gate (poly2) 312 and floating gate (poly1) 304. Thus, the flat-top FG cell 300 may allow independent control of the poly1 thickness ($T_{FG}$) and/or doping, and the oxide cap thickness Toc. In addition, the disclosed techniques allow for independent optimization of program and erase efficiency in the memory cells.

The present invention has been described in terms of one or more preferred embodiments, and it should be appreciated that many equivalents, alternatives, variations, and modifications, aside from those expressly stated (e.g., methods of manufacturing, product by process, and so forth), are possible and within the scope of the invention.

The invention claimed is:

1. A flash memory cell, comprising:
   a substrate;
   a flat-topped floating gate formed over the substrate and having a flat top surface and top corners on opposite sides of the floating gate;
   an oxide layer formed over the flat-topped floating gate, the oxide layer including:
   (a) a floating gate sidewall portion covering floating gate sidewalls on opposite lateral sides of the floating gate; and
   (b) a cap portion located above a top side of the floating gate and including vertically-extending cap portion sidewalls on opposite sides of the cap portion;
   wherein the oxide layer defines a stepped transition from the floating gate sidewall portion to the cap portion, the stepped transition covering the top corners of the floating gate, such that the cap portion of the oxide layer has a smaller lateral perimeter footprint than the floating gate sidewall portion of the oxide layer;
   a spacer layer formed over the oxide layer, the spacer layer including vertically-extending sidewall regions that are laterally aligned over the top corners of the floating gate;
   and a doped source implant region in the substrate adjacent the floating gate, the doped source implant region self-aligned with an edge of the spacer layer.

2. The flash memory cell of claim 1, wherein the cap portion of the oxide layer is flat-topped.

3. The flash memory cell of claim 1, further comprising a word line and a separate erase gate formed over the floating gate.

4. The flash memory cell of claim 3, wherein the word line overlaps the floating gate by a first distance and the erase gate overlaps the floating gate by a second distance substantially larger than the first distance.

5. The flash memory cell of claim 4, wherein the second distance is at least three times as great as the first distance.

6. The flash memory cell of claim 1, wherein at least one of the floating gate sidewalls has a generally concave shape.

7. The flash memory cell of claim 6, wherein the generally concave shape of each floating gate sidewall defines an acute angle at a top corner of the floating gate.

8. The flash memory cell of claim 1, wherein the oxide layer has a flat bottom surface in contact with the flat top surface of the floating gate, and a flat top surface.

9. The flash memory cell of claim 1, wherein the flash memory cell is a split-gate cell further comprising:
   a further flat-topped floating gate formed over the substrate and having a flat top surface;
   a further oxide layer formed over the further flat-topped floating gate;
   wherein the doped source region in the substrate extends partially under the floating gate and partially under the further floating gate.

10. The flash memory cell of claim 9, further comprising:
    a word line formed over the floating gate;
    a further word line formed over the further floating gate; and a shared erase gate formed over the floating gate and the further floating gate.

11. The flash memory cell of claim 10, wherein the word line overlaps the floating gate by a first distance and the erase gate overlaps the floating gate by a second distance substantially larger than the first distance.

12. The flash memory cell of claim 1, wherein the spacer layer comprises a nitride spacer layer.

13. A flash memory cell, comprising:
a substrate;
a flat-topped floating gate formed over the substrate and having a flat top surface;
an oxide layer formed over the flat-topped floating gate;
a doped source region in the substrate adjacent the floating gate and extending partially under the floating gate; and
a word line extending over a first lateral side of the floating gate and a separate erase gate formed extending over a second lateral side of the floating gate opposite the first lateral side of the floating gate;
wherein the word line overlaps the floating gate in a lateral direction across toward the erase gate by a first distance and the erase gate overlaps the floating gate in an opposing lateral direction toward the word line by a second distance substantially larger than the first distance, wherein the word line and erase gate do not overlap each other.

* * * * *